(12) United States Patent
Ibaraki et al.

(10) Patent No.: US 11,769,852 B2
(45) Date of Patent: Sep. 26, 2023

(54) METHOD OF CUTTING A SUBSTRATE ALONG DIVIDING LINES

(71) Applicant: NICHIA CORPORATION, Anan (JP)

(72) Inventors: Masayuki Ibaraki, Anan (JP); Minoru Yamamoto, Anan (JP); Naoto Inoue, Anan (JP); Hiroaki Tamemoto, Anan (JP)

(73) Assignee: NICHIA CORPORATION, Anan (JP)

( * ) Notice: Subject to any disclaimer, the term of this patent is extended or adjusted under 35 U.S.C. 154(b) by 274 days.

(21) Appl. No.: 16/945,729

(22) Filed: Jul. 31, 2020

(65) Prior Publication Data

US 2021/0036182 A1 Feb. 4, 2021

(30) Foreign Application Priority Data

Aug. 2, 2019 (JP) .................................. 2019-143119

(51) Int. Cl.
| | | |
|---|---|---|
| *H01L 21/00* | (2006.01) | |
| *H01L 33/00* | (2010.01) | |
| *H01L 25/075* | (2006.01) | |
| *H01L 33/20* | (2010.01) | |

(52) U.S. Cl.
CPC ...... *H01L 33/0095* (2013.01); *H01L 25/0753* (2013.01); *H01L 33/20* (2013.01)

(58) Field of Classification Search
CPC .. H01L 33/0095; H01L 25/0753; H01L 33/20
See application file for complete search history.

(56) References Cited

U.S. PATENT DOCUMENTS

| | | | |
|---|---|---|---|
| 9,722,138 B2* | 8/2017 | Peddada | H01L 33/0095 |
| 2008/0299745 A1* | 12/2008 | Morikazu | B28D 5/0011 |
| | | | 257/E21.347 |
| 2017/0098733 A1 | 4/2017 | Tamemoto et al. | |
| 2018/0062032 A1 | 3/2018 | Okamoto | |
| 2018/0175238 A1 | 6/2018 | Kitahama et al. | |
| 2018/0247871 A1 | 8/2018 | Inoue et al. | |
| 2018/0287009 A1 | 10/2018 | Nagamine et al. | |
| 2018/0301419 A1* | 10/2018 | Fanelli | H01L 21/304 |
| 2018/0304402 A1* | 10/2018 | Furuta | G01B 7/02 |

(Continued)

FOREIGN PATENT DOCUMENTS

| | | |
|---|---|---|
| JP | 2004268104 A | 9/2004 |
| JP | 2016129202 A | 7/2016 |

(Continued)

*Primary Examiner* — Ismail A Muse
(74) *Attorney, Agent, or Firm* — HUNTON ANDREWS KURTH LLP

(57) ABSTRACT

A method of manufacturing a light emitting element according to certain embodiments of the present disclosure includes: scanning and irradiating a first laser light having a first irradiation intensity to a sapphire substrate along predetermined dividing lines collectively in a shape of a tessellation of a plurality of hexagonal shapes in a top view to create a plurality of first modified regions along the predetermined dividing lines; and scanning and irradiating a second laser light having a second irradiation intensity greater than the first irradiation intensity to the sapphire substrate along the predetermined dividing lines to create a plurality of second modified regions overlapping the plurality of first modified regions.

16 Claims, 5 Drawing Sheets

(56) References Cited

U.S. PATENT DOCUMENTS

2020/0051862 A1* 2/2020 Piao .................... H01L 21/304
2020/0075797 A1   3/2020 Kitahama et al.

FOREIGN PATENT DOCUMENTS

| JP | 2016129203 A | 7/2016 |
| JP | 2017069510 A | 4/2017 |
| JP | 2018037470 A | 3/2018 |
| JP | 2018101771 A | 6/2018 |
| JP | 2018142702 A | 9/2018 |
| JP | 2018174164 A | 11/2018 |

* cited by examiner

METHOD OF CUTTING A SUBSTRATE ALONG DIVIDING LINES

CROSS-REFERENCE TO RELATED PATENT APPLICATION

The present application claims priority under 35 U. S. C. § 119 to Japanese Patent Application No. 2019-143119, filed Aug. 2, 2019. The contents of Japanese Patent Application No 2019-143119 are incorporated herein by reference in their entireties.

BACKGROUND

Technical Field

The present disclosure relates to a method of manufacturing a light emitting element, in particular, to a method of manufacturing a light emitting element having a sapphire substrate.

Description of Related Art

Singulating individual objects from a wafer state using laser lights may be performed such that the wafer is sectioned into areas of predetermined shape by predetermined dividing lines and laser lights are irradiated along the predetermined dividing lines to create modified regions, then the wafer is cut along the predetermined dividing lines. For example, JP 2004-268104A discloses a method in which predetermined dividing lines are provided in a grid-shape in a top view and the wafer is cut into individual devices with a rectangular shape. JP 2004-268104A also discloses an example in which a silicon wafer is employed.

SUMMARY

However, when a conventional laser processing method such as that described in JP 2004-268104A, etc. is used, for example, to singulate a sapphire substrate employed for light emitting elements into individual devices having a hexagonal shape, dividing with high accuracy may have been difficult.

Accordingly, it is an object of certain embodiments of the present disclosure to provide a method of manufacturing a light emitting element in which a sapphire substrate can be divided into a hexagonal shape with good accuracy.

A method of manufacturing a light emitting element according to certain embodiments of the present disclosure includes: scanning and irradiating a laser light having a first irradiation intensity to a sapphire substrate along predetermined dividing lines collectively in a shape of a tessellation of a plurality of hexagonal shapes in a top view to create a plurality of first modified regions along the predetermined dividing lines; and scanning and irradiating a laser light having a second irradiation intensity greater than the first irradiation intensity to the sapphire substrate along the predetermined dividing lines to create a plurality of second modified regions overlapping the plurality of first modified regions.

Using the method of manufacturing a light emitting element according to certain embodiment, a sapphire substrate can be singulated in a hexagonal shape with high accuracy.

DETAILED DESCRIPTION

Figure 1:
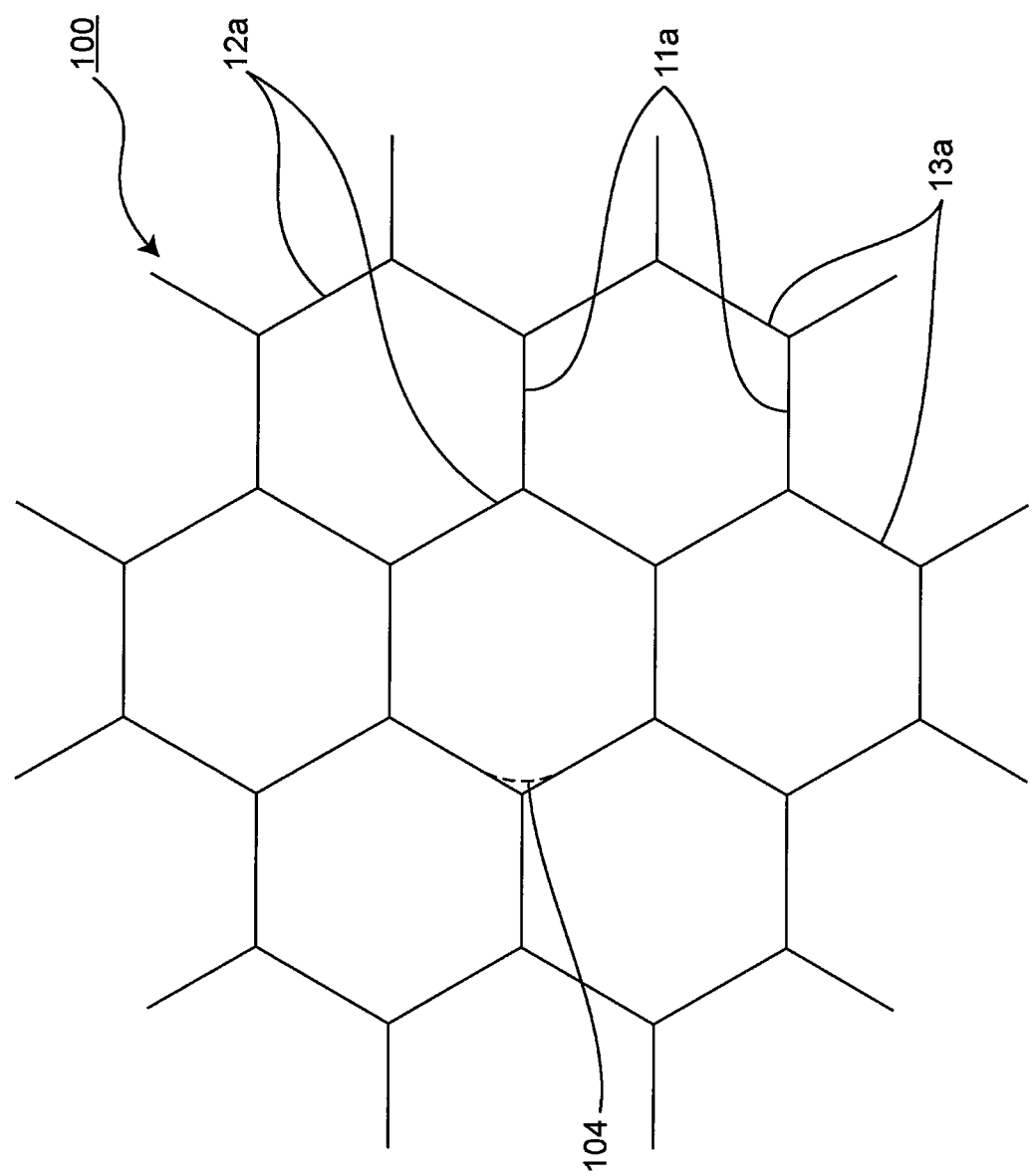
FIG. 1 is a diagram illustrating an example of predetermined dividing lines collectively in a shape of a tessellation of a plurality of a hexagonal shape.

Certain embodiments and examples of the present invention will be described below with reference to the drawings. It is to be noted that the method of manufacturing a light emitting elements described below is intended for implementing the technical concept of the present invention, and the present invention is not limited to those described below unless otherwise specified.

In the drawings, members having common functions may be denoted by the same reference numerals. For the sake of easy understanding, specific details may be given in the description in the forms of embodiments and/or examples, but procedures or components described in different embodiments and/or examples can be partially substituted or combined. In the description of embodiments and/or examples, the differences from that have been illustrated in the embodiment(s) and/or example(s) will be mainly described and description of the same or similar configuration to those have been illustrated in the embodiment(s) and/or example(s) will be appropriately omitted. In the description of the embodiments and the examples, repetitive description of similar effects obtained by similar configurations may be appropriately omitted. In the drawings, the size, positional relationship and the like of the members may be exaggerated for clarity.

The inventors of the present invention have studied singulating a sapphire substrate into individual device regions of a hexagonal shape by irradiating laser light along predetermined dividing lines defining a plurality of a hexagonal shape in a tessellation in a top view.

The laser light is preferably a pulsed laser such as a femtosecond laser or a picosecond laser. For example, the pulsed laser of a pulse width in a range of 100 fsec to 1,000 psec may be used. The laser light has a wavelength that can penetrate the sapphire substrate 5. For example, a wavelength in a range of 300 nm to 1,100 nm may be selected. Examples of laser that can penetrate the sapphire substrate 5 include a Nd:YAG laser, a Yb:YAG laser, an Nd:YVO4 laser, an Nd:YLF laser, a titanium-sapphire laser, and a KGW laser. The laser light may be set with a laser spot diameter in a range of 1 to 10 μm. For example, a laser with a spot diameter of 1.5 μm, a wavelength of 1045 nm, and a pulse width of 1 psec (picosecond) may be used. A burst pulse mode with a pulse interval in a range of several tens of picoseconds to several hundreds of nanoseconds may be used.

As shown in FIG. 1, the predetermined dividing lines 100 are formed in a tessellation of hexagonal shapes, which is an assemble of sides of a plurality of hexagonal shapes, and includes a plurality of discrete periodic straight line segments of first dividing lines 11a located on a virtual single straight line in a first direction, a plurality of discrete periodic straight line segments of second dividing lines 12a located on a virtual single straight line in a second direction, and a plurality of discrete periodic straight line segments of third dividing lines 13a located on a virtual single straight line in a third direction. That is, in terms of a single direction, the predetermined dividing lines 100 are not formed with unbroken straight lines, which is different from the predetermined dividing lines described in, for example, JP 2004-268104A in which the predetermined dividing lines are continuous lines extending in a single direction.

The predetermined dividing lines 100 are preferably respectively extending along the m-axes of the sapphire that is used for the sapphire substrate 2.

Because the predetermined dividing lines 100 are assemble of the plurality of discrete periodic straight line segments located on respective corresponding virtual straight lines and not formed with unbroken straight lines, influence on shape accuracy in the dividing into hexagonal devices was examined.

In some cases when irradiating a laser light on one of the straight segments of one of the regular hexagonal shapes, a crack generated from a modified region and extending in a lateral direction along the modified region in a top view extended beyond the predetermined dividing line into a region not to be divided. That is, when a crack extends along the modified region, the crack may be extended into a region containing a device structure, which may cause a reduction in the manufacturing yield. In some cases, as indicated by a numeral 104 in FIG. 1, dividing occurred inward of a corner of the device region of regular hexagonal shape, resulting in a reduction in the manufacturing yield.

Based on the findings described above, in order to control extension of a crack in a lateral direction (a first direction, a second direction, and a third direction) laser light of a lower intensity was irradiated on an entire portion of the predetermined dividing lines to form first modified regions in a substrate (hereinafter may be referred to as "forming first modified regions"), and subsequently, laser light of a higher intensity was irradiated on the entire portion of the predetermined dividing lines so as to overlap the first modified regions to form second modified regions (hereinafter may be referred to as "forming second modified regions"). After the step of forming second modified regions, extension of cracks beyond the segments of the predetermined dividing lines were not observed and also dividing at inward of the corners of hexagonal shape of device regions did not occur.

From the results, the first modified regions created by a laser light of lower intensity in the step of forming first modified regions is thought to serve as modified regions that guide the extension of cracks in the step of forming second modified regions, in which the first modified regions are thought to serve as starting points of cracks when they are generated at the time of forming the second modified regions in the step of forming the second modified regions. Also, the first modified regions are thought to hinder expansion of the cracks at ends of first to third predetermined dividing lines.

A method of manufacturing a light emitting element according to certain embodiments of the present disclosure includes scanning and irradiating a laser light having a first irradiation intensity to a sapphire substrate along predetermined dividing lines collectively in a shape of a tessellation of a plurality of hexagonal shapes to create a plurality of first modified regions along the predetermined dividing lines; and scanning and irradiating a laser light having a second irradiation intensity greater than the first irradiation intensity to the sapphire substrate along the predetermined dividing lines to create a plurality of second modified regions overlapping the plurality of first modified regions.

The method of manufacturing a light emitting element according to certain embodiments of the present disclosure will be described in detail below.

Figure 2:
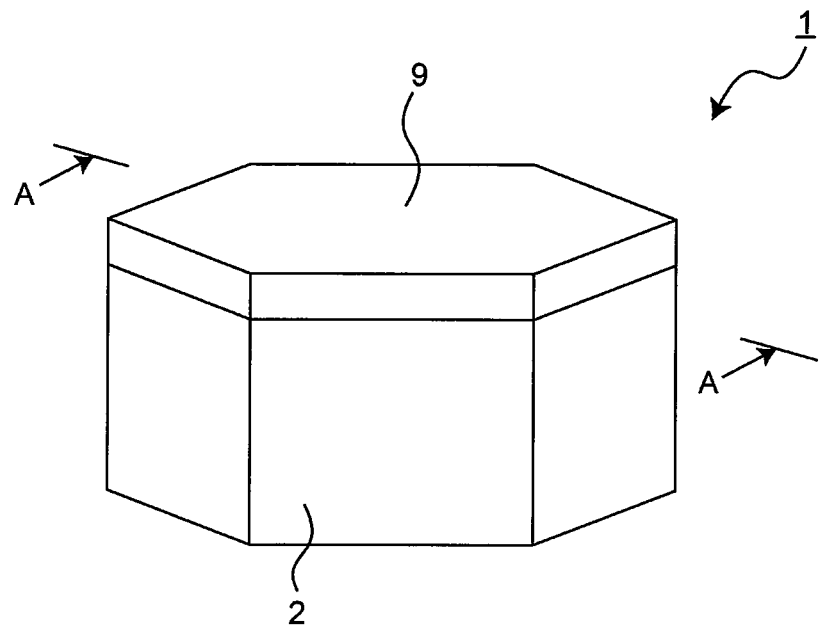
FIG. 2 is a perspective view schematically showing a configuration of a light emitting element manufactured through a method according to one embodiment of the present disclosure.

Now, with reference to FIG. 2 and FIG. 3, a light emitting element 1 obtained according to the method of manufacturing a light emitting element according to one embodiment of the present invention will be described. The light emitting element 1 includes a sapphire substrate 2 having a substantially hexagonal-column shape with an upper surface and a lower surface each having a regular hexagonal shape, a semiconductor structure 3 disposed on the upper surface of the sapphire substrate 2. The upper surface and the lower surface of the sapphire substrate 2 each have sides (sides of the regular hexagonal shape) with a length, for example, in a range of 300 to 3,000 μm.

The sapphire substrates 2 has a thickness of, for example, in a range of 50 to 500 μm.

Figure 3:
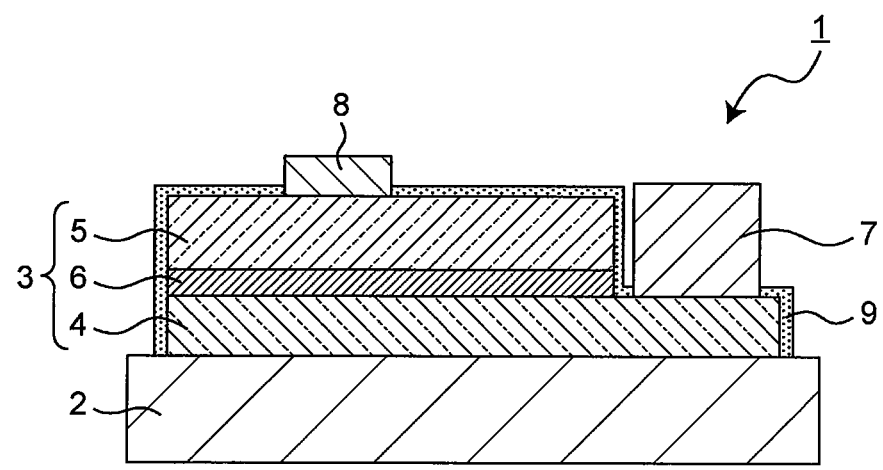
FIG. 3 is a schematic cross-sectional view of the light emitting element taken along line A-A of FIG. 2.

The semiconductor structure 3 includes, as shown in FIG. 3, a first semiconductor layer 4, a second semiconductor layer 5, and a light emitting layer 6 between the first semiconductor layer 4 and the second semiconductor layer 5. In FIG. 3, the sapphire substrate 2 is shown with a thickness smaller than a thickness of the semiconductor structure 3, but as shown in FIG. 2, alternatively, the actual sapphire substrate 2 has a thickness greater than the thickness of the semiconductor structure 3. The first semiconductor layer 4 includes, for example, an n-type semiconductor layer. The second semiconductor layer 5 includes, for example, a p-type semiconductor layer. The semiconductor structure 3 further includes a first contact electrode 7 electrically connected to the first semiconductor layer 4 and a second contact electrode 8 electrically connected to the semiconductor layer 5. The semiconductor structure 3 also has a substantially regular hexagonal shape in a top view. The semiconductor structure 3 disposed on the sapphire substrate 2 may be covered by an insulating layer 9 disposed to expose the first contact electrode 7 and the second contact electrode 8.

The insulating layer 9 may be made of, for example, $SiO_2$, $ZrO_2$, or SiN.

Now, a method of manufacturing a light emitting element 1 including a sapphire substrate 2 and having a substantially hexagonal column shape will be described below.

The method of manufacturing a light emitting element 1, the method includes:

(1) a step of providing a wafer in which a wafer 10 including a substrate made of a sapphire (a sapphire wafer), a plurality of semiconducor structures 3 respectively disposed on regions each being configured to be a sapphire substrate 2 of a light emitting element 1 after singulating, a first contact electrode 7 and a second contact electrode 8 disposed on each of the plurality of semiconductor structures 3;

(2) a step of irradiating a laser light in which a laser light is irradiated on the sapphire substrate along predetermined dividing lines 14 demarcating regions each being configured to be a sapphire substrate 2 of a light emitting element 1 after singulating; and (3) a step of singulating in which the wafer 10 is divided along the predetermined dividing lines 14 into individual light emitting elements 1.

The step (2) of irradiating a laser light further includes irradiating a laser light of a first irradiating intensity to create first modified region, and irradiating a laser light of a second irradiating intensity to create second modified regions.

Now, with reference to FIG. 4 through FIG. 7, each operation will be described in detail below.

1. Providing Wafer

A wafer 10 having a sapphire wafer and plurality of semiconductor structures 3 disposed on the sapphire wafer as described above is provided. In the present specification, the wafer 10 includes a sapphire wafer, a plurality of semiconductor structures 3 disposed on the sapphire wafer, and a first contact electrode 7 and a second contact electrode 8 disposed on each of the semiconductor structures 3. The plurality of semiconductor structures 3 are respectively formed in a substantially regular hexagonal shape in a top view. The semiconductor structures 3 having a substantially regular hexagonal shape in a top view are disposed adjacent to each other and spaced apart from each other such that sides of regular hexagonal shapes face each other and a region having a predetermined width and containing the predetermined dividing lines 14 is exposed in a top view. As described above, each of the semiconductor structures 3 may be covered by the insulating film 9. It is preferable that the insulating film 9 is also provided discretely to each semiconductor structure 3 such that the region including the predetermined dividing lines 14 is exposed at a predetermined width.

2. Irradiating Laser Light

In the irradiating a laser light, a laser light is irradiated to the sapphire wafer along the predetermined dividing lines 14 demarcating the regions configured to be respective sapphire substrates 2 of the light emitting elements 1 after singulating.

Figure 4:
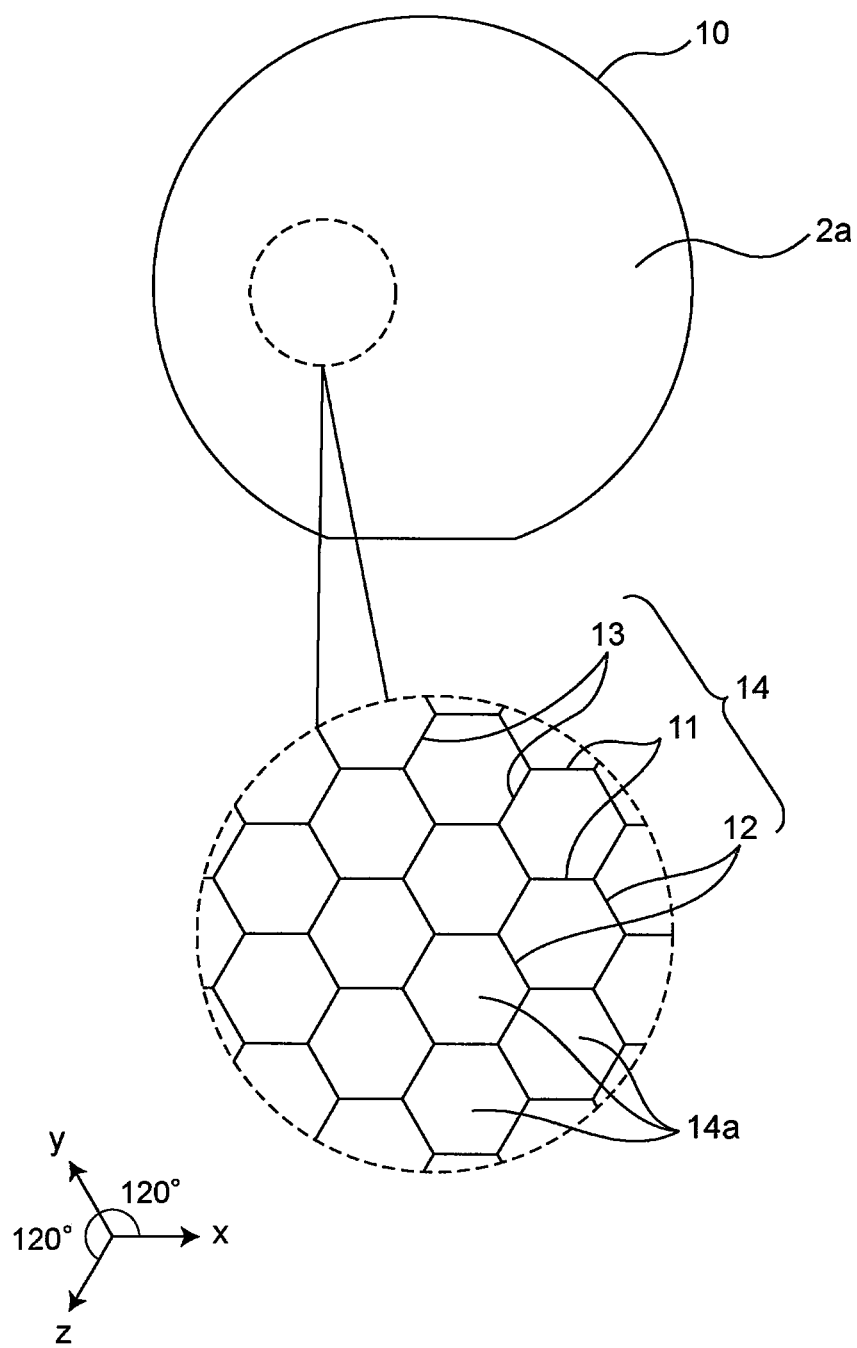
FIG. 4 is a diagram illustrating predetermined dividing lines in a method of manufacturing a light emitting element according to the present disclosure.

The predetermined dividing lines 14 are virtual lines on the sapphire wafer indicating locations to irradiate laser light, and for example, provided as center lines of regions extending between adjacent semiconductor structures 3. The predetermined dividing lines 14 are set in a laser control unit for controlling a laser irradiation device such that a laser light can be applied scanning and irradiating on the predetermined locations of the sapphire wafer. As described above, the predetermined dividing lines 14 are provided between adjacent semiconductor structures 3 and as shown in FIG. 4, collectively in a shape of tessellation of a plurality of a regular hexagonal shape. That is, within each of the regular hexagonal shapes constituting the predetermined dividing lines 14, a single semiconductor structure 3 is included. The predetermined dividing lines 14 are preferably defined such that each side of the regular hexagons 14*a* intersects with a cleavage plane of the sapphire substrate 2. In other words, the predetermined dividing lines 14 are preferably defined so as not to be aligned to the cleavage directions. Setting the predetermined dividing lines 14 not to be aligned to the cleavage directions can efficiently reduce or prevent extension of cracks in unintended directions when irradiating a laser light.

The predetermined dividing lines 14 collectively in a shape of tessellation of regular hexagonal shapes are as shown in FIG. 4, an assembly of straight line segments extending in a first direction x, a second direction y, or a third direction z separated from each other by 120 degrees. The predetermined dividing lines 14 can be classified into three predetermined dividing line groups of a first predetermined dividing line group 11 extending in the first direction x, a second predetermined dividing line group 12 extending in the second direction y, and a third predetermined dividing line group 13 extending in the third direction z.

Figure 5:
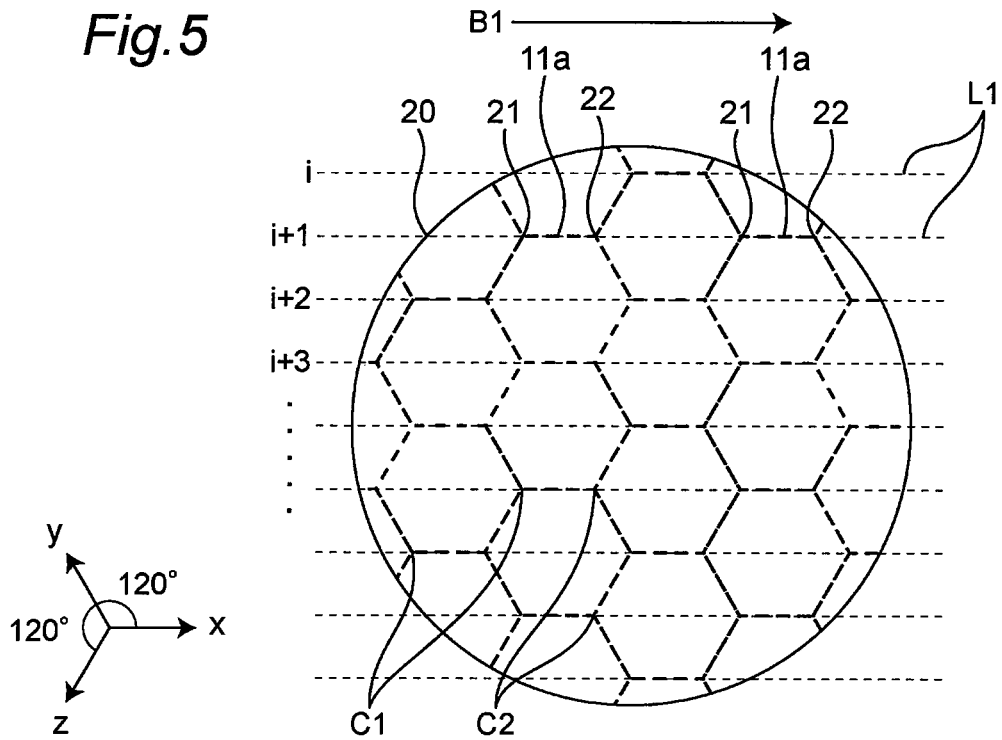
FIG. 5 is a diagram illustrating predetermined dividing lines in a method of manufacturing a light emitting element according to the present disclosure.

As to the first predetermined dividing line group 11, as shown in FIG. 5, discrete periodic straight line segments of the first predetermined dividing line group 11 are arranged at equal intervals on a plurality of rows (n-rows) of straight lines L1 extending in the first direction x. Of the n-rows of straight lines L1, adjacent straight lines L1 are spaced apart from each other with a distance a half of a distance of two opposite sides of respective regular hexagons 14*a*. Each of the first predetermined dividing lines 11*a* aligned on a single straight line L1 is a side of a regular hexagon 14*a*. The first predetermined dividing lines 11*a* aligned on a single straight line L1 are spaced apart from each other at a distance corresponding to a diagonal length between two opposite corners of the regular hexagon 14*a*.

Figure 6:
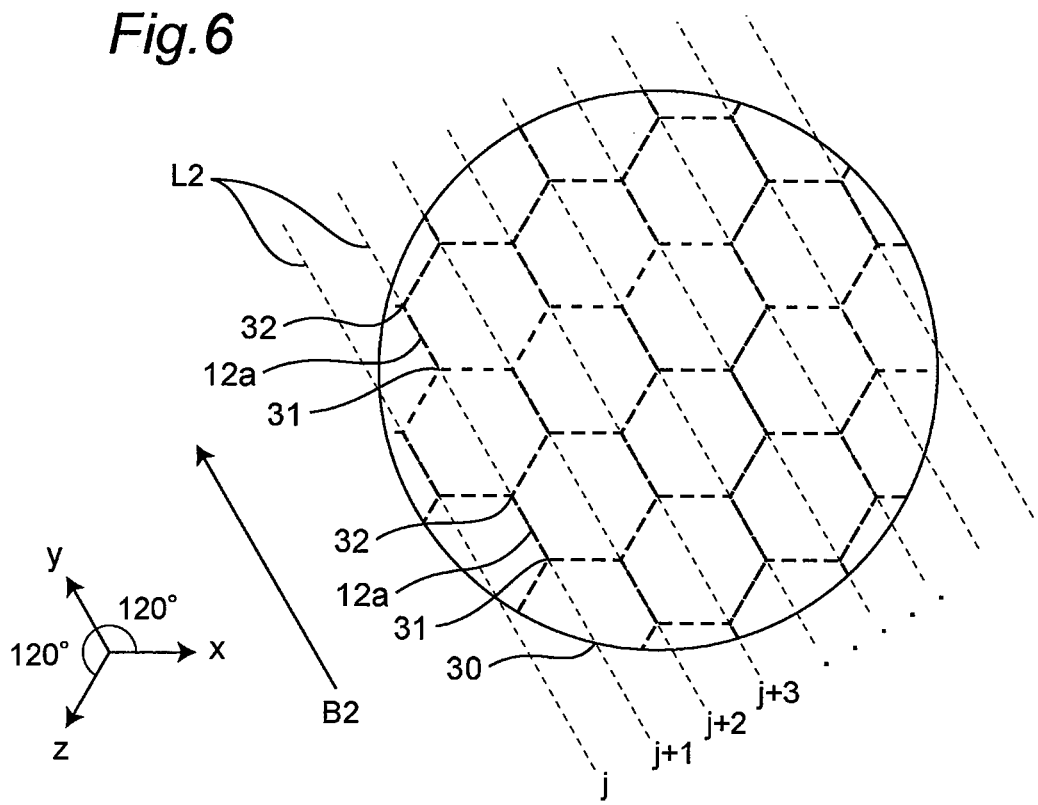
FIG. 6 is a diagram illustrating predetermined dividing lines in a method of manufacturing a light emitting element according to the present disclosure.

Similarly, as to second predetermined dividing line group 12, as shown in FIG. 6, discrete periodic straight line segments of the second predetermined dividing line group 12 are arranged at equal intervals on a plurality of rows (m-rows) of straight lines L2 extending in the second direction y. Of the m-rows of straight lines L2, adjacent straight lines are spaced apart from each other with a distance a half of a distance of two opposite sides of respective regular hexagons 14*a*. Each of the second predetermined dividing lines 12*a* aligned on a single straight line L2 is a side of a regular hexagon 14*a*. The second predetermined dividing lines 12*a* aligned on a single straight line L2 are spaced apart from each other at a distance corresponding to a diagonal length between two opposite corners of the regular hexagon 14*a*.

Figure 7:
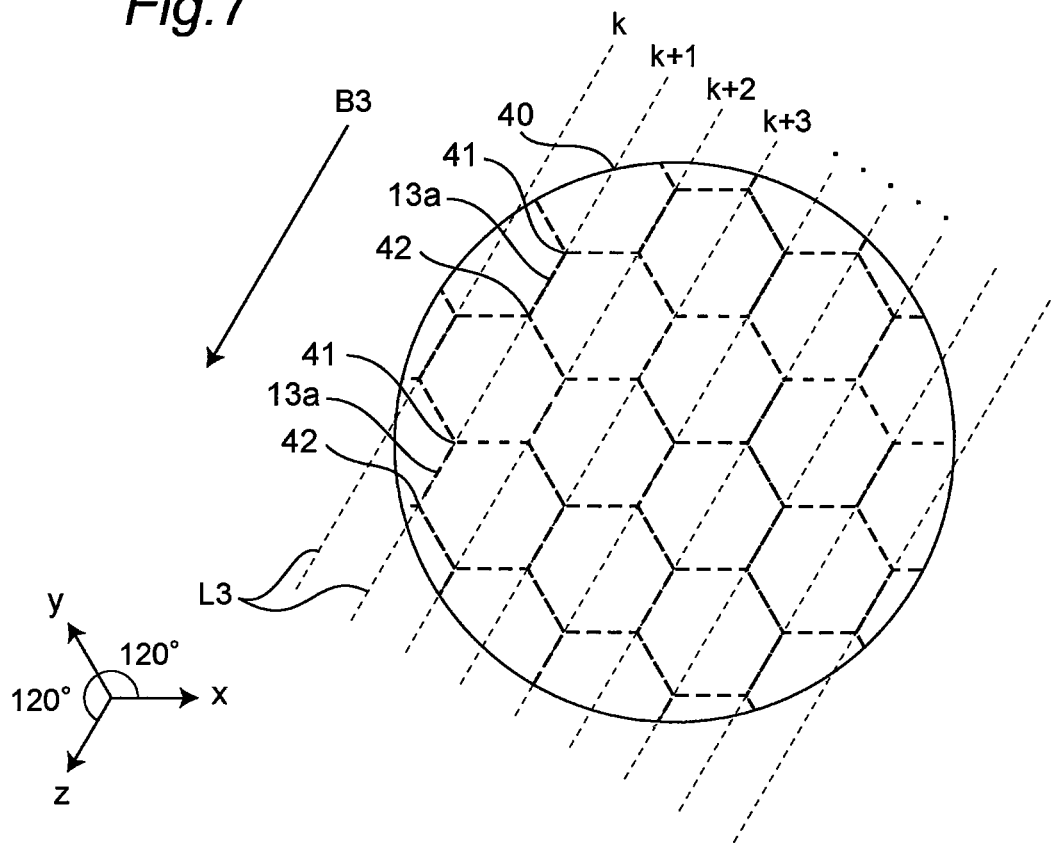
FIG. 7 is a diagram illustrating predetermined dividing lines in a method of manufacturing a light emitting element according to the present disclosure.

Similarly, as to third predetermined dividing line group 13, as shown in FIG. 7, discrete periodic straight line segments of the third predetermined dividing line group 13 are arranged at equal intervals on a plurality of rows (l-rows) of straight lines L3 extending in the second direction y. Of the m-rows of straight lines L3, adjacent straight lines are spaced apart from each other with a distance a half of a distance of two opposite sides of respective regular hexagons 14*a*. Each of the third predetermined dividing lines 13*a* aligned on a single straight line L3 is a side of a regular hexagon 14*a*. The third predetermined dividing lines 13*a* aligned on a single straight line L3 are spaced apart from each other at a distance corresponding to a diagonal length between two opposite corners of the regular hexagon 14*a*.

Next, the step of creating first modified regions and the step of creating second modified regions respectively by irradiating a laser light along the predetermined dividing lines 14 will be described.

In the present specification, the term "irradiating a laser light along predetermined dividing lines 14" refers to irradiating a laser light to predetermined locations of the sapphire wafer determined by the predetermined dividing lines 14.

Creating First Modified Regions

In the step of creating first modified regions, a laser light of the first irradiation intensity is applied along the predetermined dividing lines 14 set to the sapphire substrate, scanning and irradiating on the irradiation surface (target surface) 2*a* of the sapphire wafer to create first modified regions in the sapphire substrate 2. The irradiation surface (target surface) 2*a* of the sapphire wafer to which the laser light is irradiated may either be a side having the semiconductor structures or a back surface side that is the opposite side of the surface having the semiconductor structure, as long as the first modified regions can be created at a predetermined depth in a thickness direction of the sapphire wafer. Subsequent step of creating second modified regions can also be performed in a similar manner. The step of creating the first modified regions is to create modified regions to guide extension of cracks that would occur in the subsequent step of creating second modified regions. For this reason, the first modified regions may have a thickness relatively smaller than the thickness of the sapphire substrate 2.

The laser light is caused to scan along a straight line at a constant speed such that in a single linear scanning, the laser light is irradiated along the predetermined dividing lines 11a, 12a, and 13a that are periodically assumed on a single straight line. Because the predetermined dividing lines 11a, 12a, and 13a are assumed at a uniform interval on a single straight line, irradiation of the laser light is caused by ON/OFF switching at predetermined intervals.

In the present specification, scanning by the laser light is performed either by shifting light source of the laser light to shift the location to irradiate the laser light, by shifting the wafer 10 while the light source of the laser light is kept still to shift the location to irradiate the laser light, or by shifting both the light source of the laser light and the wafer 10 to shift the location to irradiate the laser light.

The step of creating first modified regions includes first irradiating to third irradiating respectively irradiating a laser light to three groups of the predetermined dividing lines, the first to third predetermined dividing line groups 11, 12, and 13.

First Irradiating

In the step of first irradiating, a laser light is irradiated to the group of first predetermined dividing lines 11. Each of the first predetermined dividing lines 11a extends in a first direction in parallel to first opposite sides which are opposite sides of each of the plurality of hexagonal shapes. As shown in FIG. 5, a step of first scanning and irradiating, in which a laser light is caused to scan along a first direction x and irradiated to a plurality of the first predetermined dividing lines 11a located on a single straight line L1 extending in the first direction, is repeated by parallelly shifting locations by half the distance between opposite sides of the regular hexagonal shape 14a (first repeating step), such that the laser light is irradiated on the entire portion of the group of first predetermined dividing lines 11.

First Scanning and Irradiating

Next, the step of first scanning and irradiating will be described with reference to FIG. 5. In the description below, a straight line L1 on the (i+1)th row will be illustrated as an example.

As shown by an arrow B1 in FIG. 5, the laser light is assumed to scan from left to right in FIG. 5. FIG. 5 shows a portion of the wafer 10 such as a portion encircled in FIG. 4 (likewise in FIG. 6 and FIG. 7), in which a point 20 indicates a point on the straight line L1 on the (i+1)th row is located on the pass of scanning.

At the point 20 on the (i+1)th row shown in FIG. 5, irradiation of the laser light is in the OFF state.

With the irradiation in the OFF state, the laser light is caused to scan from the point 20 to the direction indicated by the arrow B1 along the straight line L1 on the (i+1)th row. When the laser light reaches a first end 21 of the first predetermined dividing line segment 11a, irradiation of the laser light is switched ON. The first end 21 is one of the corners of the regular hexagon 14a. The laser light is caused to scan along the first predetermined dividing line segment 11a with the irradiation in On-state, and the irradiation is switched in OFF state at a second end 22 of the first predetermined dividing line segment 11a. The second end 22 is also one of the corners of the regular hexagon 14a. The laser light is caused to scan along the first predetermined dividing line segment 11a with the irradiation in OFF-state, and the irradiation is switched in ON state at a first end 21 of next segment of the first predetermined dividing line 11a. The laser light is caused to scan along the first predetermined dividing line segment 11a with the irradiation in ON-state, and the irradiation is switched in OFF state at a second end 22 of the first predetermined dividing line segment 11a.

As described above, while repeating switching ON/OFF of the irradiation of the laser light at the respective first ends 21 and the second ends 22, the laser light is irradiated on all the first predetermined dividing lines 11a arranged on the straight line L1 at the (i+1)th row.

As described above, when the first scanning and irradiating on a single straight line is finished, a target position of the laser light is pallalelly shifted by half the distance between opposite sides of the regular hexagonal shape 14a and the laser light is irradiated on all the first predetermined dividing lines 11a arranged on the straight line L1 at the (i+2)th row. Likewise, the first scanning and irradiating is successively repeated.

As described above, a laser light of the first irradiation intensity is caused to scan and irradiated along all the first predetermined dividing lines 11 of the entire group of first predetermined dividing lines to create the first modified regions at the predetermined locations in the sapphire wafer.

Second Irradiating

The step of second irradiating is performed after the first irradiating. The scanning direction of the laser light is turned counterclockwise by 120° with respect to the first direction and the laser light is irradiated to the group of second predetermined dividing lines 12 aligned on the second straight lines L2 extending in the second direction y. Each of the second predetermined dividing lines 12a extends in a second direction in parallel to second opposite sides which are opposite sides different from the first opposite sides of each of the plurality of hexagonal shapes.

As shown in FIG. 5, a step of first scanning and irradiating, in which a laser light is caused to scan along a first y and irradiated to a plurality of the first predetermined dividing lines 11a located on a single straight line L2 extending in the first direction, is repeated by parallelly shifting locations by half the distance between opposite sides of the regular hexagonal shape 14a such that the laser light is irradiated on the entire portion of the group of second predetermined dividing lines 12.

Second Scanning and Irradiating

Next, second scanning and irradiating will be described with reference to FIG. 6. In the description below, a straight line L2 on the (j+1)th row will be illustrated as an example.

As shown by an arrow B2 in FIG. 6, the laser light is assumed to scan from lower right to upper left in FIG. 6. In FIG. 6, a point 30 indicates a point on the straight line L2 on the (j+1)th row that is located on the pass of scanning.

At the point 30 on the second straight line L2 on the (j+1)th row shown in FIG. 6, irradiation of the laser light is in the OFF state.

With the irradiation in the OFF state, the laser light is caused to scan from the point 30 to the direction indicated by the arrow B2 along the straight line L2. When the laser light reaches a first end 31 of the second predetermined dividing line segment 12a, irradiation of the laser light is switched ON. The first end 31 is one of the corners of the regular hexagon 14a. The laser light is caused to scan along the second predetermined dividing line segment 12a with the irradiation in ON-state, and the irradiation is switched in OFF state at a second end 32 of the second predetermined dividing line segment 12a. The second end 32 is also one of the corners of the regular hexagon 14a. The laser light is caused to scan along the second predetermined dividing line segment 12a with the irradiation in OFF-state, and the irradiation is switched in ON-state at a first end 31 of the second predetermined dividing line segment 12a. The laser light is caused to scan along the second predetermined dividing line segment 12a with the irradiation in ON-state, and the irradiation is switched in OFF state at a second end 32 of the second predetermined dividing line segment 12a.

As described above, while repeating switching ON/OFF of the irradiation of the laser light at the respective first ends and the second ends, the laser light is irradiated to all the second predetermined dividing lines 12a aligned on the second straight line L2 at the (j+1)th row.

As described above, when the second scanning and irradiating on a single straight line is finished, the target position of the laser light is parallelly shifted by half the distance between opposite sides of the regular hexagonal shape 14a and the laser light is irradiated on all the second predetermined dividing lines 11a arranged on the second straight line L2 at the (i+2)th row. Likewise, the first scanning and irradiating is successively repeated.

As described above, a laser light of the first irradiation intensity is caused to scan and irradiated along all the second predetermined dividing lines 12 of the group of second predetermined dividing lines 12a to create the second modified regions at in the sapphire wafer.

Third Irradiating

The step of third irradiating is performed after the second irradiating. The scanning direction of the laser light is turned counterclockwise by 120° with respect to the second direction and the laser light is irradiated to the group of third predetermined dividing lines 13 aligned on the straight lines L3 extending in the third direction z. Each of the third predetermined dividing lines 13a extends in a third direction in parallel to third opposite sides which are opposite sides different from the first opposite sides and the second opposite sides of each of the plurality of hexagonal shapes.

As shown in FIG. 7, a step of third scanning and irradiating, in which a laser light is caused to scan along a third direction z and irradiated to a plurality of the third predetermined dividing lines 13a aligned on a single straight line L3 extending in the third direction, is repeated by parallelly shifting locations by half the distance between opposite sides of the regular hexagonal shape 14a (third repeating step), such that the laser light is irradiated on the entire portion of the group of third predetermined dividing lines 13.

Third Scanning and Irradiating

Next, third scanning and irradiating will be described with reference to FIG. 7. In the description below, a straight line L3 on the (k+1)$^{th}$ row will be illustrated as an example.

As shown by an arrow B3 in FIG. 7, the laser light is assumed to scan from upper right to lower left in FIG. 7. In FIG. 7, a point 40 indicates a point on the straight line L3 on the (k+1)th row is located on the pass of scanning.

At the point 40 on the straight line L3 on the (k+1)th row shown in FIG. 7, irradiation of the laser light is in the OFF state.

With the irradiation in the OFF state, the laser light is caused to scan from the point 40 to the direction indicated by the arrow B3 along the straight line L3 on the (k+1)th row. When the laser light reaches a first end 41 of the third predetermined dividing line segment 13a, irradiation of the laser light is switched ON. The first end 41 is one of the corners of the regular hexagon 14a. The laser light is caused to scan along the third predetermined dividing line segment 13a with the irradiation in ON-state, and the irradiation is switched in OFF state at a second end 42 of the third predetermined dividing line segment 13a. The second end 42 is also one of the corners of the regular hexagon 14a. The laser light is caused to scan along the third predetermined dividing line segment 13a with the irradiation in OFF-state, and the irradiation is switched in ON state at a first end 41 of the third predetermined dividing line segment 13a. The laser light is caused to scan along the third predetermined dividing line segment 13a with the irradiation in ON-state, and the irradiation is switched in OFF state at a second end 42 of the third predetermined dividing line segment 13a.

As described above, while repeating switching ON/OFF of the irradiation of the laser light at the respective first ends and the second ends, the laser light is irradiated to all the third predetermined dividing lines 13a aligned on the straight line L3 at the (k+1)th row.

As described above, when the third scanning and irradiating on a single straight line is finished, the target position of the laser light is pallalelly shifted by half the distance between opposite sides of the regular hexagonal shape 14a and the laser light is irradiated on all the third predetermined dividing lines 11a aligned on the straight line L3 at the (k+2)th row. Likewise, the third scanning and irradiating is successively repeated.

As described above, a laser light of the first irradiation intensity is caused to scan and irradiated along all the third predetermined dividing lines 13 to create the first modified regions at in the sapphire wafer.

As described above, the first modified regions corresponding to the entire predetermined dividing lines 14 are formed in the sapphire wafer. The entire of the first modified regions may be referred to as a first modified layer.

ON/OFF Switching Point

As described above, in the steps of first to third scanning and irradiating, irradiation of the laser light is switched in ON state when the scanning laser light reaches respective first ends 21, 31, and 41 that are corners of the regular hexagonal shapes 14a, the irradiation of the laser light is continued along the sides of the regular hexagonal shapes 14a, and when the scanning laser light reaches respective second ends 21, 31, and 41 that are respective ends of the sides and corners of the regular hexagonal shapes 14, the irradiation of the laser light is switched in OFF state. However, due to a limitation in position precision of the laser irradiation device and/or of the scanning mechanism such as a stage to shift the wafer 10, complete conformity of switching ON/OFF of irradiation of the laser light with the first ends 21, 31, and 41 is difficult to achieve. If complete conformity of the ON/OFF of irradiation of the laser light with the first ends 21, 31, and 41 is set, irradiation of the laser light beyond the respective predetermined dividing lines may result. For this reason, in view of position precision of the scanning mechanism, the locations of ON/OFF of irradiation of the laser light, in other words, start points and end points of laser irradiation, are preferably set inward of the respective straight line segments with respect to the first ends 21, 31, and 41, and the second ends 22, 32, and 42, as shown in FIG. 8.

Figure 8:
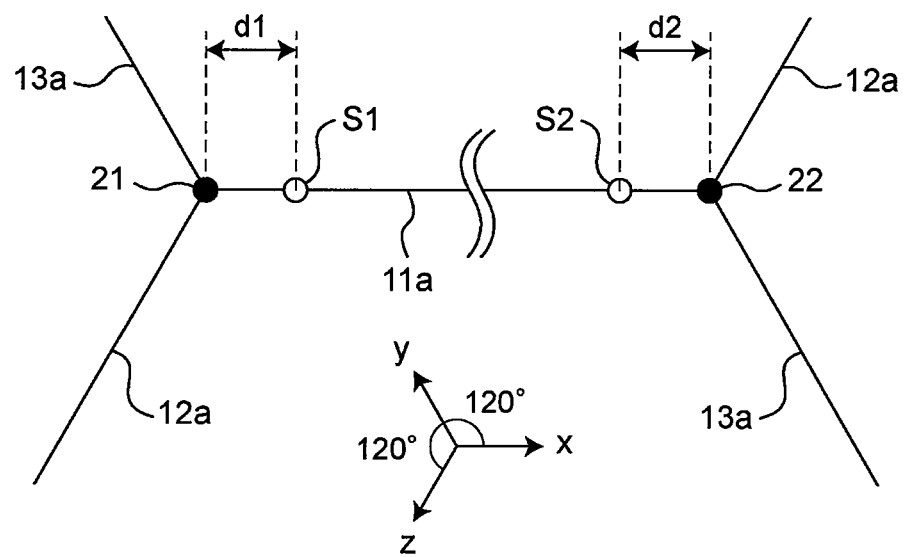
FIG. 8 is a diagram illustrating a start point and an end point of laser light irradiation in a method of manufacturing a light emitting element according to the present disclosure.

More specifically, as illustrated with the first predetermined dividing line segment 11a in FIG. 8, the first end 21 and the start point of laser irradiation S1 may be spaced by, for example, a tolerance distance for starting irradiation d1 that is a distance at a maximum positional deviation exhibited by the scanning mechanism. Likewise, the second end 22 and the stop point of laser irradiation S2 may be spaced by, for example, a tolerance distance for stopping irradiation d2 that is a distance at a maximum positional deviation exhibited by the scanning mechanism. The tolerance distance for starting irradiation d1 and the tolerance distance for stopping irradiation d2 are determined mainly based on the accuracy of the scanning mechanism of the laser light irradiating device, but preferably determined with a consideration of deviation in switching operation of the laser light. Accordingly, irradiation of the laser light into the device regions deviated from the predetermined dividing lines 11a, 12a, or/and 13a can be reduced or prevented.

Creating Second Modified Regions

In the step of creating second modified regions, the laser light is irradiated with a second irradiating intensity that is greater than the first irradiating intensity used to create the first modified regions in the step of creating first modified regions. The laser light is caused to scan and irradiated in similar manner as in the step of first scanning and irradiating, in the step of second scanning and irradiating, and in the step of third scanning and irradiating, respectively performed in the step of creating first modified regions. The laser light used in the step of creating second modified regions is set to be converged in the sapphire wafer (laser-converging position in a depth direction), for example, similar to that in the step of creating first modified regions. The second modified regions are created overlapping with the first modified regions and with a greater thickness than the first modified regions that is created in the step pf creating first modified regions. In the step of creating second modified regions, the laser light is irradiated to create modified regions to create cracks extending substantially along the predetermined dividing lines 14 such that the sapphire substrate 2 can be divided along the predetermined dividing lines 14. In order to achieve this, the irradiation intensity of the second laser light is higher than that in the step of creating first modified regions. Accordingly, the second modified regions has a thickness in the depth direction greater than that of the first modified regions. The entire of the second modified regions may be referred to as a second modified layer.

ON/OFF Switching Point in Creating Second Modified Regions

As described above, in the steps of first to third scanning and irradiating, irradiation of the laser light is switched in ON state when the scanning laser light reaches respective first ends 21, 31, and 41 that are corners of the regular hexagonal shapes 14a, the irradiation of the laser light is continued along the sides of the regular hexagonal shapes 14a, and when the scanning laser light reaches respective second ends 21, 31, and 41 that are respective ends of the sides and corners of the regular hexagonal shapes 14, the irradiation of the laser light is switched in OFF state. As in the step of creating first modified regions, in view of position precision of laser light scanning mechanism, the locations of the start points and the end points of laser irradiation, are preferably set inward of the respective straight line segments with respect to the first ends 21, 31, and 41.

More specifically, as illustrated with the first predetermined dividing line segment 11a in FIG. 1, the first end 21 and the start point of laser irradiation S1 may be spaced by, for example, a tolerance distance for starting irradiation d1 that is a distance at a maximum positional deviation exhibited by the scanning mechanism. Likewise, the second end 22 and the stop point of laser irradiation S2 may be spaced by, for example, a tolerance distance for stopping irradiation d2 that is a distance at a maximum positional deviation exhibited by the scanning mechanism. The tolerance distance for starting irradiation d1 and the tolerance distance for stopping irradiation d2 are determined mainly based on the accuracy of the scanning mechanism of the laser light irradiating device, but preferably determined with a consideration of deviation in switching operation of the laser light. The laser light is applied in a similar manner on the second predetermined dividing lines 12a and the third predetermined dividing lines 13a.

In the step of creating second modified regions, the distance between the first end 21 and the start point of irradiation S1 is preferably controlled such that the laser light is not irradiated to a location closer to the first end 21 than the start point of irradiation S1 made in the step of creating first modified regions, when a positional deviation occurs due to the scanning mechanism and/or operational deviation in switching of the laser light etc. In order to comply with the above requirement, the start point S1 in the step of creating second modified regions is preferably set further from the first end 21 than the start point S1 in the step of creating first modified regions. For example, in the step of creating second modified regions, a distance between the first end and the start point S1 of irradiation may be set twice of the tolerance distance d1 for starting irradiation in creating first modified regions. Similar may be applied to the stop point of irradiation. The stop point S2 in the step of creating second modified regions is preferably set further from the second end 22 than the stop point S2 in the step of creating first modified regions. For example, in the step of creating second modified regions, a distance between the second end and the stop point S2 of irradiation may be set twice of the tolerance distance d2 for stopping irradiation in creating first modified regions.

Setting the start point of irradiation S1 and the stop point of irradiation S2 in the step of creating second modified regions as described above allows for efficient reduction or prevention of propagation (extension) of cracks created upon forming the second modified regions, such that propagation or occurrence of cracks within the device regions can be efficiently reduced or prevented.

The greater the thickness of the sapphire substrate 2, the greater propagation region of the crack is needed. Thus, a greater pulse energy is preferable when creating the second modified regions, but on the other hand, a greater pulse energy tends to increase the occurrence of meandering etc., of the cracks. Accordingly, when the sapphire substrate 2 is thick, after performing the steps of creating first modified regions and second modified regions, an additional step of irradiating laser light with a pulse energy greater than that used in the step of creating first modified regions is preferably performed. With such an additional step, the propagation region of the cracks can be increased. The depth of the additional step is preferably within a range of the modified region created by the steps of creating first modified regions and second modified regions. This arrangement can reduce the possibility of the cracks caused in the additional step from branching off from the cracks created by the steps of creating first modified regions and second modified region and propagating separately. Such an additional step may be performed plural times.

When a sapphire substrate 2 having a thickness of 200 μm is used, the first intensity of irradiation may be, for example, in a range of 0.6 to 10.0 μJ, preferably in a range of 0.6 to 5.0 μJ, and the second intensity of irradiation may be, for example, in a range of 0.7 to 30.0 μJ, preferably in a range of 0.7 to 6.0 μJ. The laser light may be converged to a point, for example, 30 μm from the irradiation surface 2a of the sapphire substrate.

Laser Light to be Applied

Laser light to be irradiated to the sapphire substrate in the step of creating first modified region and in the step of creating second modified regions is, for example, a pulsed laser with a repetition rate f. When a pulsed laser is used, the laser light is caused to scan along a straight line at a uniform speed v in the step of creating first modified regions and in the step of creating second modified regions, such that irradiation spots (i.e., the first modified regions and the second modified regions) formed by the pulsed laser are respectively located at a pitch P determined as v×1/f. When a pulsed laser is used, different pitches P may be used in the step of creating first modified regions and the step of creating second modified regions. In such a case, it is preferable that the repetition rates f1 and f2, and the speeds v1 and v2 are respectively set such that the pitch P2 applied in the step of creating second modified regions has intervals greater than that of the pitch P1 applied in the step of creating first modified regions. This arrangement allows for a further reduction in the tolerance distance for starting irradiation d1 and the tolerance distance for stopping irradiation d2 in the step of creating modified regions, such that the laser light can be irradiated to the locations closer to the first ends 21, 31, and 41 and the second ends 22, 32, 42. Accordingly, extension of cracks due to irradiation of the laser light applied in the step of creating second modified regions can be prevented from reaching over the predetermined dividing lines. In the step of creating first modified regions, the pulsed laser may be used with a repetition rate f1 of, for example, 50 kHz and a scanning speed v1, for example, in a range of 50 to 300 mm/sec. Accordingly, the pitch P1 of the pulsed laser in the step of creating first modified regions may be, for example, in a range of 1 to 6 μm. In the step of creating second modified regions, the pulsed laser may be used with a repetition rate f2 of, for example, 50 kHz and a scanning speed v2, for example, in a range of 100 to 500 mm/sec. Accordingly, the pitch P2 of the pulsed laser in the step of creating second modified regions may be, for example, in a range of 2 to 10 μm.

When pulsed laser is used, the tolerance distances for starting irradiation d1, d1' and the tolerance distances for stopping irradiation d2, d2' are set such that the tolerance distance for starting irradiation d1 and the tolerance distance for stopping irradiation d2 in the step of creating first modified regions are greater than pitch P1 of laser spots in the step of creating first modified regions, and the tolerance distance for starting irradiation d1' and the tolerance distance for stopping irradiation d2' in the step of creating second modified regions are greater than pitch P2 of laser spots in the step of creating second modified regions. Accordingly, extension of cracks due to irradiation of the laser light applied in the step of creating second modified regions can be prevented from reaching over the predetermined dividing lines.

3. Singulating

In the step of singulating, the (sapphire) wafer 10 is divided along the first modified regions and the second modified regions into a plurality of individual devices. The singulating is preferably performed after the cracks created in the modified regions are sufficiently extended. In particular, the singulating is preferably performed after the cracks extending from the second modified regions reach the upper and lower surfaces of the sapphire substrate 2.

The method of manufacturing a light emitting element as described above includes irradiating a laser light with a smaller, first irradiation intensity along an entire of the predetermined dividing lines 14 to create first modified regions within the substrate, and with increasing the irradiating intensity, irradiating a laser light with a second irradiation intensity along an entire of the predetermined dividing lines to create first modified regions within the substrate along an entire of the predetermined dividing lines 14 to create second modified regions within the substrate, such that the second modified regions overlapped the first modified regions. With this arrangement, extension of cracks beyond the segments of the predetermined dividing lines 14 can be prevented and also, dividing at inward of the corners of regular hexagonal shape of device regions can be prevented.

Moreover, in the method of manufacturing a light emitting element described above, the start points of irradiating laser light S1 and the stop points of irradiating laser light S2 are set in consideration of positioning accuracy of operation devices, such that irradiation of laser light deviated from the predetermined dividing lines 14 into the device regions of regular hexagonal shape can be efficiently prevented.

Further, in the method of manufacturing a light emitting element described above, setting the predetermined dividing lines 14 along which the laser light to be irradiated are set in a direction intersecting with the cleavage plane of the sapphire substrate can reduce or prevent occurrence of cracks extending beyond the predetermined dividing lines 14 caused by the cleavability of the sapphire substrate. With this arrangement, the manufacturing yield at the time of dividing the sapphire substrate 2 can be improved.

An example will be described below.

In the example, a pulsed laser light having a repetition rate of 50 kHz was used to divide a sapphire wafer having a thickness of 200 μm. The predetermined dividing lines 14 are collectively set in a shape of a tessellation of regular hexagons in a top view. In the step of creating first modified regions, the pulsed laser light was caused to scan with pulse energy of 2.8 μJ at 100 mm/s. Also, in the step of creating first modified regions, the tolerance distance for starting irradiation d1 defining the start point S1 of laser irradiation was 3 μm and the tolerance distance for stopping irradiation d2 defining the stop point S2 of laser irradiation was 3 μm. In the step of creating second modified regions, the pulsed laser light was caused to scan with pulse energy of 4.0 μT at 200 mm/s. In the step of creating second modified regions, the tolerance distance for starting irradiation d1 defining the start point S1 of laser irradiation was 5 μm and the tolerance distance for stopping irradiation d2 defining the stop point S2 of laser irradiation was 5 μm.

In the steps of creating first modified regions and second modified regions, the converging position of the pulsed laser was set 30 μm from the upper surface of the sapphire wafer.

The sapphire wafer was divided under the conditions described above. Dividing of high shape accuracy was confirmed.

While the present invention has been described according to the embodiments and the aspects with a certain degrees of details, contents of disclosure of the embodiments and aspects shall be varied in details of the configuration, and the combination of elements and the change of order in the embodiments and aspects can be realized without deviating from the scope of the claims and contents of the present invention.

What is claimed is:

1. A method of manufacturing a light emitting element, the method comprising:
   scanning and irradiating a laser light having a first irradiation intensity to a sapphire substrate along predetermined dividing lines collectively in a shape of a tessellation of a plurality of hexagonal shapes in a top view to create a plurality of first modified regions along the predetermined dividing lines; and
   scanning and irradiating a laser light having a second irradiation intensity greater than the first irradiation intensity to the sapphire substrate along the predetermined dividing lines to create a plurality of second modified regions overlapping the plurality of first modified regions;
   wherein the step of creating first modified regions comprises:
      a step of first irradiating a laser light successively to all of the predetermined dividing lines extending in a first direction in parallel to first opposite sides which are opposite sides of each of the plurality of hexagonal shapes;
      a step of second irradiating a laser light successively to all of the predetermined dividing lines extending in a second direction in parallel to second opposite sides which are opposite sides different from the first opposite sides of each of the plurality of hexagonal shapes; and
      a step of third irradiating a laser light successively to all of the predetermined dividing lines extending in a third direction in parallel to third opposite sides which are opposite sides different from the first opposite sides and the second opposite sides of each of the plurality of hexagonal shapes, and
      wherein the step of first irradiating a laser light comprises:
   a step of first scanning and irradiating in which a laser light is caused to scan along the first direction and irradiated to a plurality of segments of first predetermined dividing lines located on a single straight line extending in the first direction; and
   a first repeating step in which a target position of the laser light is parallelly shifted by half a distance between the first opposite sides and repeats the first scanning and irradiating;
   the step of second irradiating a laser light comprises:
   a step of second scanning and irradiating in which a laser light is caused to scan along the second direction and irradiated to a plurality of segments of second predetermined dividing lines located on a single straight line extending in the second direction; and
   a second repeating step in which a target position of the laser light is parallelly shifted by half a distance between the second opposite sides and repeats the second scanning and irradiating; and
   the step of third irradiating a laser light comprises:
   a step of third scanning and irradiating in which a laser light is caused to scan along the third direction and irradiated to a plurality of segments of third predetermined dividing lines located on a single straight line extending in the third direction; and
   a third repeating step in which a target position of the laser light is parallelly shifted by half a distance between the third opposite sides and repeats the third scanning and irradiating.

2. The method of manufacturing a light emitting element according to claim 1, wherein an extending direction of each side of each of the plurality of hexagonal shapes intersects with a cleavage plane of the sapphire substrate.

3. The method of manufacturing a light emitting element according to claim 2, wherein
   the step of first irradiating a laser light comprises:
      a step of first scanning and irradiating in which a laser light is caused to scan along the first direction and irradiated to a plurality of segments of first predetermined dividing lines located on a single straight line extending in the first direction; and
      a first repeating step in which a target position of the laser light is parallelly shifted by half a distance between the first opposite sides and repeats the first scanning and irradiating;
   the step of second irradiating a laser light comprises:
      a step of second scanning and irradiating in which a laser light is caused to scan along the second direction and irradiated to a plurality of segments of second predetermined dividing lines located on a single straight line extending in the second direction; and
      a second repeating step in which a target position of the laser light is parallelly shifted by half a distance between the second opposite sides and repeats the second scanning and irradiating; and
   the step of third irradiating a laser light comprises:
      a step of third scanning and irradiating in which a laser light is caused to scan along the third direction and irradiated to a plurality of segments of third predetermined dividing lines located on a single straight line extending in the third direction; and
      a third repeating step in which a target position of the laser light is parallelly shifted by half a distance between the third opposite sides and repeats the third scanning and irradiating.

4. The method of manufacturing a light emitting element according to claim 3, wherein the pitch of the pulsed laser in the step of creating first modified regions is in a range of 1 to 6 µm, and the pitch of the pulsed laser in the step of creating second modified regions is in a range of 2 to 10 µm.

5. The method of manufacturing a light emitting element according to claim 4, wherein the first irradiation intensity in the step of creating first modified regions is in a range of 0.6 to 10.0 µJ, and the second irradiation intensity in the step of creating second modified regions is in a range of 0.7 to 30.0 µJ.

6. The method of manufacturing a light emitting element according to claim 3, wherein the first irradiation intensity in the step of creating first modified regions is in a range of 0.6 to 10.0 µJ, and the second irradiation intensity in the step of creating second modified regions is in a range of 0.7 to 30.0 µJ.

7. The method of manufacturing a light emitting element according to claim 1, wherein the laser light is a pulsed laser, and the laser light is irradiated on the predetermined dividing lines at predetermined pitches respectively in the step of creating first modified regions and in the step of creating second modified regions;
   in the step of creating first modified regions, a distance between an end of a single segment of the predetermined dividing lines and a start point of laser irradiation is greater than the pitch in the step of creating first modified regions, and a distance between another end of the single segment of the predetermined dividing lines and a stop point of laser irradiation is greater than the pitch in the step of creating first modified regions; and in the step of creating second modified regions, a distance between an end of a single segment of the predetermined dividing lines and a start point of laser irradiation is greater than the pitch in the step of creating second modified regions and, a distance between another end of the single segment of the predetermined dividing lines and a stop point of laser irradiation is greater than the pitch in the step of creating second modified regions.

8. The method of manufacturing a light emitting element according to claim 1, wherein the laser light in the step of creating first modified regions is a pulsed laser, the laser light in the step of creating second modified regions is a pulsed laser, the laser light is irradiated on the predetermined dividing lines at predetermined pitches in the step of creating first modified regions, and the laser light is irradiated on the predetermined dividing lines at predetermined pitches in the step of creating second modified regions; and wherein the pitch in the step of creating first modified regions is smaller than the pitch in the step of creating second modified regions.

9. The method of manufacturing a light emitting element according to claim 8, wherein the laser light is a pulsed laser, and the laser light is irradiated on the predetermined dividing lines at predetermined pitches respectively in the step of creating first modified regions and in the step of creating second modified regions;

in the step of creating first modified regions, a distance between an end of a single segment of the predetermined dividing lines and a start point of laser irradiation is greater than the pitch in the step of creating first modified regions, and a distance between another end of the single segment of the predetermined dividing lines and a stop point of laser irradiation is greater than the pitch in the step of creating first modified regions; and in the step of creating second modified regions, a distance between an end of a single segment of the predetermined dividing lines and a start point of laser irradiation is greater than the pitch in the step of creating second modified regions, and a distance between another end of the single segment of the predetermined dividing lines and a stop point of laser irradiation is greater than the pitch in the step of creating second modified regions.

10. The method of manufacturing a light emitting element according to claim 8, wherein the pitch of the pulsed laser in the step of creating first modified regions is in a range of 1 to 6 μm, and the pitch of the pulsed laser in the step of creating second modified regions is in a range of 2 to 10 μm.

11. The method of manufacturing a light emitting element according to claim 10, wherein the first irradiation intensity in the step of creating first modified regions is in a range of 0.6 to 10.0 μJ, and the second irradiation intensity in the step of creating second modified regions is in a range of 0.7 to 30.0 μJ.

12. The method of manufacturing a light emitting element according to claim 8, wherein the first irradiation intensity in the step of creating first modified regions is in a range of 0.6 to 10.0 μm, and the second irradiation intensity in the step of creating second modified regions is in a range of 0.7 to 30.0 μJ.

13. A method of manufacturing a light emitting element, the method comprising:

scanning and irradiating a laser light having a first irradiation intensity to a sapphire substrate along predetermined dividing lines collectively in a shape of a tessellation of a plurality of hexagonal shapes in a top view to create a plurality of first modified regions along the predetermined dividing lines; and scanning and irradiating a laser light having a second irradiation intensity greater than the first irradiation intensity to the sapphire substrate along the predetermined dividing lines to create a plurality of second modified regions overlapping the plurality of first modified regions;

wherein the laser light in the step of creating first modified regions is a pulsed laser, the laser light in the step of creating second modified regions is a pulsed laser, the laser light is irradiated on the predetermined dividing lines at predetermined pitches in the step of creating first modified regions, and the laser light is irradiated on the predetermined dividing lines at predetermined pitches in the step of creating second modified regions; and wherein the pitch in the step of creating first modified regions is smaller than the pitch in the step of creating second modified regions.

14. The method of manufacturing a light emitting element according to claim 13, wherein the pitch of the pulsed laser in the step of creating first modified regions is in a range of 1 to 6 μm, and the pitch of the pulsed laser in the step of creating second modified regions is in a range of 2 to 10 μm.

15. The method of manufacturing a light emitting element according to claim 14, wherein the first irradiation intensity in the step of creating first modified regions is in a range of 0.6 to 10.0 μJ, and the second irradiation intensity in the step of creating second modified regions is in a range of 0.7 to 30.0 μJ.

16. The method of manufacturing a light emitting element according to claim 13, wherein the first irradiation intensity in the step of creating first modified regions is in a range of 0.6 to 10.0 μJ, and the second irradiation intensity in the step of creating second modified regions is in a range of 0.7 to 30.0 μJ.

* * * * *